(12) United States Patent
Matthies

(10) Patent No.: US 6,221,438 B1
(45) Date of Patent: Apr. 24, 2001

(54) PATTERNED DEPOSITION OF A MATERIAL

(75) Inventor: Dennis Lee Matthies, Princeton, NJ (US)

(73) Assignee: Sarnoff Corporation, Princeton, NJ (US)

(*) Notice: Subject to any disclaimer, the term of this patent is extended or adjusted under 35 U.S.C. 154(b) by 0 days.

(21) Appl. No.: 09/250,328

(22) Filed: Feb. 16, 1999

Related U.S. Application Data
(60) Provisional application No. 60/106,803, filed on Nov. 3, 1998.

(51) Int. Cl.$^7$ .............................. B05D 1/04; B05D 1/36; B05D 3/04; B05D 5/06
(52) U.S. Cl. ................. 427/466; 427/458; 427/470; 427/66; 427/68; 427/258; 427/335; 427/337; 427/377; 427/402
(58) Field of Search .................... 427/458, 466, 427/469, 470, 472, 474, 475, 66, 67, 68, 71, 197, 202, 203, 258, 335, 337, 377, 372.2, 402; 361/226, 227, 228

(56) References Cited

U.S. PATENT DOCUMENTS

| | | | |
|---|---|---|---|
| 3,145,156 | * 8/1964 | Oster | 204/180 |
| 3,635,157 | * 1/1972 | Taylor et al. | 101/114 |
| 4,734,228 | * 3/1988 | Micheron et al. | 264/22 |
| 4,816,285 | * 3/1989 | Ribnitz | 427/10 |
| 5,066,512 | * 11/1991 | Goldowsky et al. | 427/466 |
| 5,120,423 | * 6/1992 | Kurita et al. | 205/200 |
| 5,142,343 | 8/1992 | Hosokawa et al. . | |
| 5,283,132 | 2/1994 | Ogura et al. . | |
| 5,408,109 | 4/1995 | Heeger et al. . | |
| 5,644,327 | 7/1997 | Onyskevych et al. . | |
| 5,688,551 | * 11/1997 | Littman et al. | 427/64 |
| 5,807,627 | 9/1998 | Friend et al. . | |
| 5,821,690 | 10/1998 | Martens et al. . | |
| 5,844,363 | 12/1998 | Gu et al. . | |
| 5,846,595 | * 12/1998 | Sun et al. | 427/2.14 |

OTHER PUBLICATIONS

S. C. Thayer "Active–Driven TFEL Displays Using Ceramic Tiling", SID 93 DIGEST, pp. 618–621.

S. C. Thayer, "Late–News Paper: Modular Wall–Size IC–Driven Flat–Panel Displays", SID 92 DIGEST, pp. 950–953.

* cited by examiner

*Primary Examiner*—Shrive Beck
*Assistant Examiner*—Michael Barr
(74) *Attorney, Agent, or Firm*—William J. Burke; Abhik A. Huq

(57) ABSTRACT

A display structure is formed using patterned deposition of display materials. A substrate includes a plurality of distinct electrodes. A plurality of droplets including a material are formed and charged to a second polarity. First selected ones of the plurality of electrodes are charged to a first polarity opposite the second polarity to selectively attract the droplets including the material to the oppositely charged first selected ones of the plurality of electrodes.

20 Claims, 2 Drawing Sheets

PATTERNED DEPOSITION OF A MATERIAL

This application claims the benefit of priority from U.S. Provisional application No. 60/106,803 filed Nov. 3, 1998.

FIELD OF THE INVENTION

The present invention relates to a method of depositing a material in a pattern, and, more particularly, to selectively depositing charged droplets including display materials onto electrodes.

BACKGROUND OF THE INVENTION

The general concept of patterned deposition of a material onto a substrate has many applications. Some methods of patterned deposition are additive and others are subtractive. Additive methods deposit the material only where desired. In contrast, subtractive methods deposit the material and then selectively remove (subtract) the material exclusive of the desired pattern.

One application of patterned deposition is the patterned deposition of toner particles to reproduce images. Patterned deposition may also be used to deposit patterns of different colored phosphors to form color pixels on the screen of a cathode ray tube (CRT).

Shadowing is an additive method for depositing a pattern of a material onto a substrate. For shadowing, a shadow mask is formed above or on the substrate. The material is then directionally deposited onto the substrate through apertures in the shadow mask. As a result of the deposition being directional, the material is not deposited in the "shadows" of the structure. Thus, the material is deposited in a pattern defined by the portion of the substrate exclusive of the "shadows" and the structure. By varying the direction of deposition, this technique may be used to deposit different patterns of one or more different materials on a single substrate.

Another method of patterned deposition uses a patterned photoconductor to electrostatically attract charged particles of a material onto a pattern on a substrate. For example, as used in photocopiers, a photoconductor is first applied to the substrate. The photoconductor is then electrostatically charged. The charged photoconductor on the substrate is exposed to light in a desired pattern to selectively discharge the photoconductor. Particles of the material (toner), charged to an opposite polarity than the charge of the patterned photoconductor, are brought into proximity with the substrate. The attraction between opposite charges results in the deposition of the toner onto the substrate in the pattern formed by the charged photoconductor. Paper is then brought in contact with the substrate to deposit the patterned toner onto the paper. The paper may then be heated to fuse the toner to the paper.

Another method of patterned deposition may be used for forming patterns of different colored phosphors corresponding to different colors in pixels on the screen of a cathode ray tube (CRT). For example, a photoconductor may be deposited on the screen and then charged. The photoconductor may then be selectively exposed to form a pattern of charge. Oppositely charged phosphor particles of a first color are then formed. Electrostatic attraction causes the phosphor particles of the first color to attach to the screen positions where the charges were selectively deposited. The phosphors may then be secured to the screen by curing. The process may then be repeated to form patterns of additional colors of phosphor on the screen.

For some applications and for some materials it may be desirable to deposit a pattern while the material is in liquid form. Inkjet technology may be used to deposit a liquefied material in a pattern formed by a plurality of positions on a substrate. First, the liquefied material is supplied to the inkjet. The inkjet and the substrate are then positioned so the inkjet output is adjacent one of the plurality of positions on the substrate. The material in the inkjet is then discharged toward the one of the plurality of positions on the substrate. The inkjet is then repositioned and the process is repeated for each of the plurality of positions on the substrate.

The cost and complexity of an inkjet apparatus may increase when the positions on the substrate are small and when the deposition of material must be localized. Material discharged from an inkjet typically disperses once it exits from the inkjet. To localize deposition, the extent of dispersion may be limited by precisely locating the inkjet close to the substrate.

An inkjet method may also be costly when the number of positions on the substrate is large. When material is to be deposited on many distinct positions on the substrate, using an inkjet is costly due to the time necessary to reposition the inkjet in relation to the substrate for deposition at each of the positions. Alternatively, multiple inkjets may be used to simultaneously deposit material at more than one position. This alternative may be cost prohibitive due to the cost of the multiple ink jets and their operating and maintenance costs.

Inkjet deposition of a liquid may be undesirable for depositing a precise quantity of material. After repeated discharges, an inkjet may begin to clog. A clogged inkjet may not discharge as much material as an unclogged inkjet. Thus, the amount of material per discharge may vary from position to position on the substrate, depending on the extent to which the inkjet is clogged at the various positions.

To overcome the shortcomings of conventional methods of patterned deposition, a new method of deposition is provided.

SUMMARY OF THE INVENTION

The present invention provides a method of deposition. A substrate having a plurality of distinct electrodes is provided. A plurality of portions of a material are formed and charged to a first polarity. The plurality of portions of the material are selectively attracted to the first selected electrodes.

According to one aspect of the present invention, the plurality of portions are selectively deposited on the first selected electrodes.

According to another aspect of the present invention, the plurality of portions of the material are deposited on a second substrate disposed adjacent the first selected electrodes.

According to another aspect of the invention, each of the plurality of portions of the material charged to the first polarity is included in one of a plurality of liquid droplets.

According to another aspect of the invention, the charging of at least one of the first selected ones of the plurality of electrodes is selectively controlled responsive to a value corresponding to a quantity of the material attached to the at least one electrodes.

According to another aspect of the invention, the display material corresponds to a first color and material corresponding to a second color is similarly deposited onto second selected ones of the plurality of electrodes.

According to another aspect of the invention, the first selected ones of the plurality of electrodes are charged to one of the second polarity and a neutral polarity while material corresponding to the second color is attracted to the second selected ones of the plurality of electrodes.

According to another aspect of the invention, multiple material layers are formed by deposition of droplets including multiple materials.

According to another aspect of the invention, liquid droplets charged to the second polarity are formed, each droplet including a first solution and a second solution, the first solution including a hole transport material and a first solvent, the second solution including an organic electroluminescent material and a second solvent, wherein at least one of the droplets is selectively attached to at least one of the distinct electrodes wherein the hole transport material and the organic electroluminescent material in the at least one of the plurality of liquid droplets separate before the solvent evaporates to form a hole transport material layer and an organic electroluminescent layer upon the at least one of the distinct electrodes.

The present invention also provides a structure formed using a method according to the present invention. The structure includes a first substrate having a plurality of distinct electrodes and a plurality of portions of a material formed upon each of the plurality of distinct electrodes.

The present invention also provides an apparatus for forming a plurality of distinct portions of a material according to the present invention. The apparatus includes a substrate having a plurality of distinct electrodes, a source for forming a plurality of portions of a material charged to a first polarity, and charging means for applying a charge to selected ones of the plurality of electrodes.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures.

DETAILED DESCRIPTION

Figure 1:
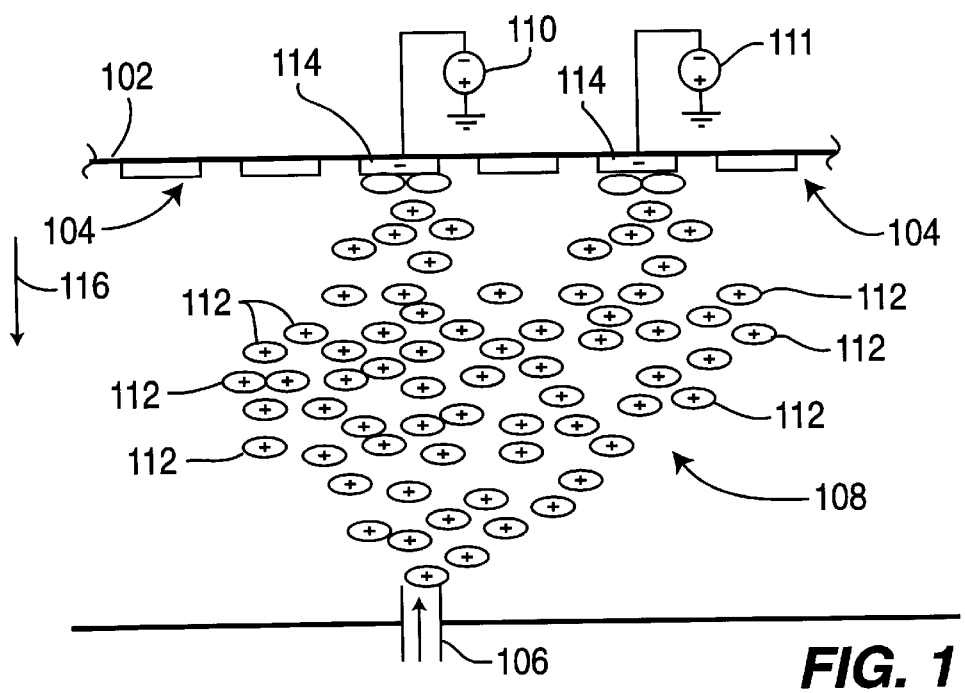
FIG. 1 illustrates an exemplary method of deposition according to the present invention.

Referring now to the drawing, in which like reference numerals refer to like elements throughout, FIG. 1 illustrates an exemplary method of deposition according to the present invention. As shown in FIG. 1, a plurality of distinct electrodes 104 are formed on a substrate 102. Portions 112 of a material are selectively deposited onto first selected ones 114 of the plurality of distinct electrodes 104.

A source 106 generates a cloud 108 including a plurality of portions 112 of the material charged to a first polarity. The portions 112 of the material may be charged by methods including induction charging and corona charging. First selected ones 114 (first selected electrodes) of the plurality of electrodes 104 are charged to a second polarity opposite the first polarity. As known to those skilled in the art, the first selected electrodes 114 may be charged using a voltage source 110, for example. Each of the first selected electrodes 114 may be controlled by a single voltage source or by separate voltage sources as illustrated by voltage source 111. Alternatively, the first selected electrodes 114 may be charged by an electron beam or by corona charging.

As known to those skilled in the art, the source 106 may be adapted to provide portions of material in particle form. Alternatively, in an exemplary embodiment, the source 106 is adapted to provide liquid droplets including portions 112 of the material charged to the first polarity. Liquid droplets may be formed by methods including ultrasonic, rotary, and liquid jet formation of droplets. Formation of a cloud 108 including a plurality of portions 112 of a charged material is taught by Adrian G. Bailey, in "Electrostatic Spraying of Liquids", which is hereby incorporated by reference.

In the exemplary embodiment shown in FIG. 1, the portions 112 of the material are charged to a positive polarity and the first selected electrodes 114 are charged to a negative potential. The charged portions 112 of the material in the cloud 108 are attracted by an electrostatic force to the oppositely charged first selected electrodes 114. The electrostatic force causes the portions 112 of material to migrate toward and attach to first selected electrodes 114 and to other previously deposited portions 112 on the first selected electrodes 114.

Attachment is influenced by factors including electrostatic forces, van der Waal forces, sintering and interdiffusion. Post attachment treatments such as heat, humidity and pressure and application of solvent vapor may be may be applied to promote the attachment of the portions 112 of material. A post attachment heat treatment may be used to promote interdiffusion. A post attachment humidity treatment may promote local dissolution at points of contact to promote interdiffusion. A post attachment application of pressure may increase pressures at points of contact to promote sintering and to increase the contact area for the van der Waal forces.

When a desired number of portions 112 of material become attached to one of the first selected electrodes 114, further deposition to that electrode may be halted by charging that electrode at the same potential as the portions 112 of the material so the portions 112 of the material are repelled from that electrode. Alternatively, that electrode may be tied to a neutral potential and/or the output of the source 106 may be halted. Another alternative is to leave that electrode floating so any additional deposited charge will repel further portions 112 of charged material.

As illustrated in the exemplary embodiment of FIG. 1, the portions 112 of material are attracted to the first selected electrodes 114 in a direction different from the direction of the force of gravity illustrated by arrow 116 in FIG. 1. This results in substantially all of the portions 112 of the material which are deposited onto the substrate 102 being deposited on the oppositely charged first selected electrodes 114.

Figure 2:
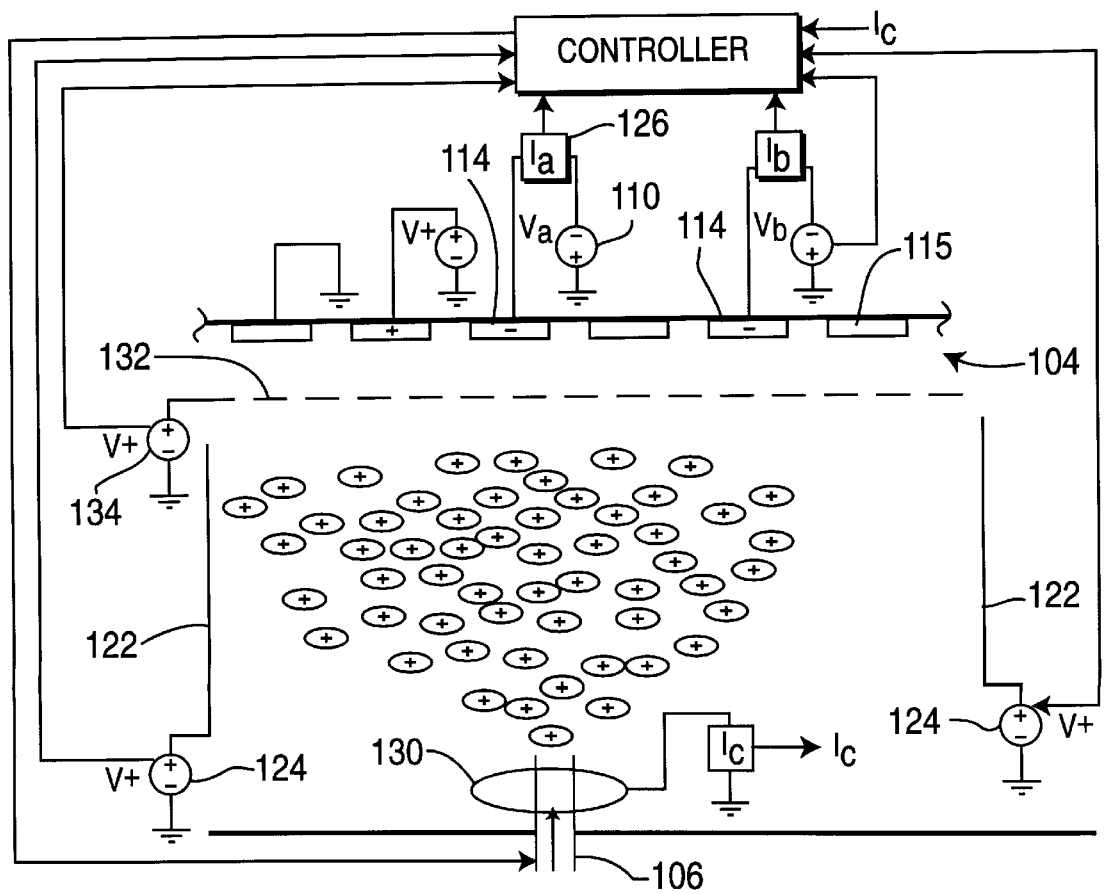
FIG. 2 illustrates another exemplary method of deposition according to the present invention.

In another exemplary embodiment, as shown in FIG. 2, the charge applied to at least one of the first selected electrodes 114 is controlled responsive to the number of portions 112 of the material which are deposited onto that at least one electrode. As known to one skilled in the art, there are several methods for measuring the number of portions 112 of material which are deposited onto a particular electrode.

One method is to measure the current flowing into a particular electrode as a result of the charged portions 112 of the material contacting and attaching to that particular electrode. As shown in FIG. 2, a current meter 126 coupled to an electrode can be used to monitor the current input $I_a$ to an electrode. The number of particles attached to a particular electrode may be calculated by integrating the current $I_a$ to determine the amount of charge deposited on that electrode and dividing that charge by the amount of charge per portion. The charge per portion 112 may be calculated using the charge to mass (q/m) ratio of the material and the amount of material per droplet. The charge applied to that particular electrode by the voltage source 110 may then be controlled responsive to the number of portions 112 desired to be deposited onto the particular electrode.

Another method of monitoring the number of portions of material 112 which are deposited onto the electrodes is to use an inductive coil 130 to measure and integrate the current $I_c$ associated with the portions 112 of the material which are formed by the source 106. Alternatively, the charge input (not shown) to the source 106 that is used to charge the portions 112 of material may also be measured to indicate the charge associated with the portions 112 of the material. The charge associated with the portions 112 of the material in combination with models of the distribution of the portions 112 of material with respect to the first selected electrodes 114 may be used to selectively control output of the source 106 and/or the charge applied to each of the first selected electrodes 114.

The amount of deposited material may also be controlled using models to approximate deposition rather than using actual measurements. For example, using models of the distribution of portions 112 of material, the quantity of material per portion 112, and the timed duration of deposition, the source 106 and/or charge applied to the first selected electrodes 114 may be controlled to control the amount of deposited material.

A self-limiting method may also be used to control the amount of material deposited on each of the first selected electrodes 114. For example, each of the first selected electrodes 114 may be charged at a second polarity with predetermined quantities of charge and left floating. Portions of this charge are neutralized as each portion 112 of material charged to the opposite polarity attaches to one of the first selected electrodes 114. As the amount of charge that is neutralized increases, the attraction of the charged portions 112 of material to the electrodes decreases. The predetermined charge on each of the first selected electrodes 114 may be unique to that electrode and chosen based on models of the distribution of the charged portions 112 of the material.

To enhance the selectiveness of the method of deposition, electrodes other than the first selected electrodes 114 may be charged to the same polarity as the portions 112 of the material to repel the portions 112 of the material. Alternatively, electrodes other than the first selected electrodes 114 may be coupled to a ground potential. If the other electrodes are left floating, the charge on portions 112 of material attached thereto will accumulate and help repel other charged portions 112 of material.

A method of deposition according to the present invention may be used to form a plurality of different patterns of different materials on a single substrate. For example, a source 106 may provide charged portions 112 of a first material to form a cloud 108. First selected electrodes 114 may then be charged at a second polarity opposite the polarity of the portions 112 of the material. As described above, the portions 112 of the material will then be attracted to and deposited onto the first selected electrodes 114.

The source 106 (or another source) may then form charged portions of a second material to form a cloud of portions of the second material. Second selected electrodes 115 of the plurality of electrodes 104 may then be charged to the second polarity opposite the polarity of the portions of the second material. This results in the portions of the second material being electrostatically attracted toward and attached to the second selected electrodes 115.

The portions 112 of the material produced by the source 106 are charged at the same polarity and have a tendency to repel each other. This may result in dispersion of the cloud 108. In an exemplary embodiment, sidewalls 122 of the deposition apparatus are charged by a source 124 to the same polarity as the portions 112 of the material to reduce this dispersion.

Alternatively, non-conductive sidewalls 124 may be used without a source 124. As charged portions 112 attach to the sidewalls 124, charge of the same polarity as the charged portions 112 of the material will accumulate on the non-conductive sidewalls 124. The accumulated charge of the same polarity as the charged portions 112 will repel the charged portions 112 to reduce the dispersion of the cloud 108.

In an exemplary embodiment, a grid 132 may be used to enhance the selectivity of the deposition onto the first selected electrodes 114. The grid 132 may be charged by a supply 134 to the same polarity as the portions 112 of the material to be deposited onto the first selected electrodes 114. Using the grid 132 may improve the selectivity of deposition by repelling weakly charged portions 112 of the material. Alternatively, the grid 132 may be charged to an opposite charge than the portions 112 of the material for accelerating the portions 112 through the gaps in the grid toward the first selected electrodes 114.

In an exemplary embodiment, the plurality of electrodes 104 are column electrodes formed on a front plate of a display structure. The portions 112 of the material may be deposited using a method according to the present invention in a continuous line onto selected ones of the column electrodes. Such deposition may be desirable for forming a plasma or television display structure. In another exemplary embodiment, a mask is placed adjacent the column electrodes to expose only first selected portions of the selected ones of the column electrodes. A method of deposition according to the present invention may then be used to deposit the portions 112 of the material on the first selected portions of the column electrodes. Using a mask may be desirable for forming an organic electroluminescent display structure.

Figure 3:
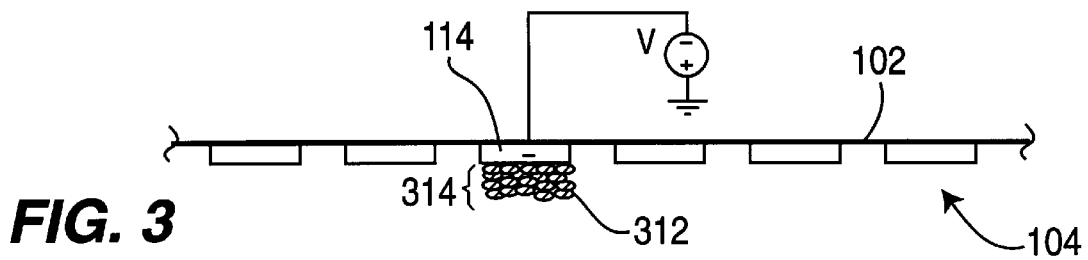
FIGS. 3–4 illustrate a first exemplary method of multilayer material deposition according to the present invention.
Figure 4:
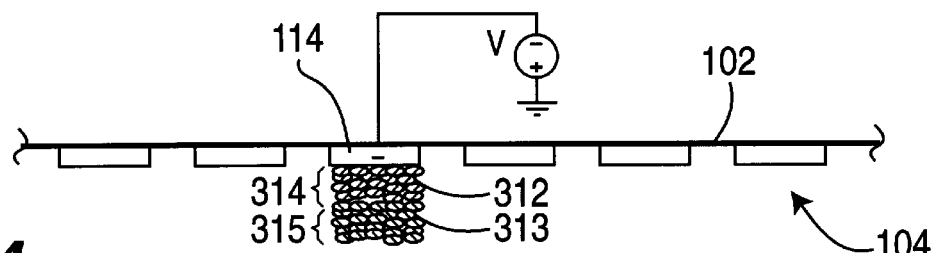

FIGS. 3–4 illustrate a first method of multi-layer material deposition according to the present invention. As shown in FIG. 3, portions 312 of a first material may be selectively deposited according to the present invention on first selected electrodes 114. The plurality of portions 312 of the first material form a first material layer 314 upon the first selected electrodes 114.

As shown in FIG. 4, portions 313 of a second material may be selectively deposited according to the present invention on the first material layer 314. The portions 313 of the second material form a second material layer 315 upon the first material layer 314 formed upon the first selected electrodes 114.

Figure 5:
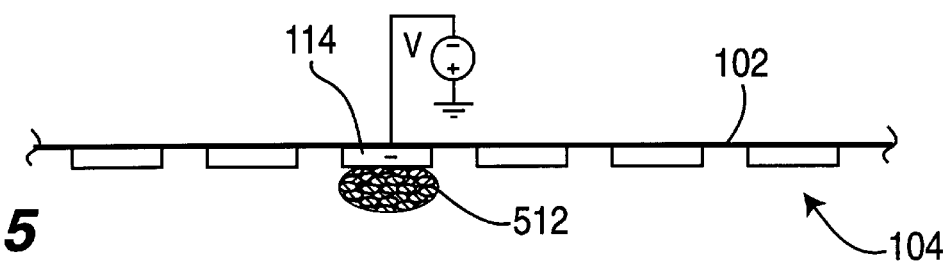
FIGS. 5–6 illustrate a second exemplary method of multilayer material deposition according to the present invention.
Figure 6:
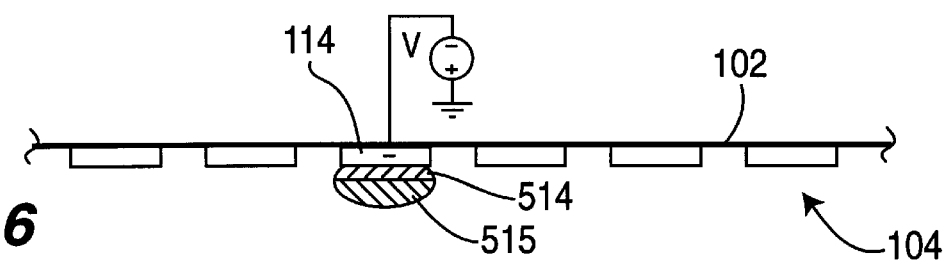

FIGS. 5–6 illustrate a second method of multi-layer material deposition according to the present invention. The source 106 (not shown, see FIG. 1) provides charged liquid droplets 512 including the first material and its corresponding first solvent and the second material and its corresponding a second solvent. As shown in FIG. 5, these droplets are deposited according to the present invention on the first selected electrodes 114.

The droplets 512 including the first and second materials may then coalesce to form a single drop including the first and second materials. In an exemplary embodiment, the first and second solvents are immissible and the first and second materials and the solvents are adapted so the first and second materials separate as shown in FIG. 6 before the solvents evaporates. After the solvents evaporate, a layer 514 of the first material and a layer 515 of the second material remain on the first selected electrodes 114. Thus, a single deposition step may be used to deposit a layer of a first material 514 and a layer of a second material 515 upon the first selected electrodes 114. The teachings of the present invention may be used to form more than two layers in a single deposition step by including more than two materials in the droplets.

Alternatively, separate droplets including the first material and separate droplets including the second material may be formed by one or more sources 106. The separate droplets may be charged to the same polarity may repel each other and not contact each other before deposition. The separate droplets may then be deposited on the first selected electrodes. The droplets may then coalesce and the materials may separate as described above for multilayer deposition.

Figure 7:
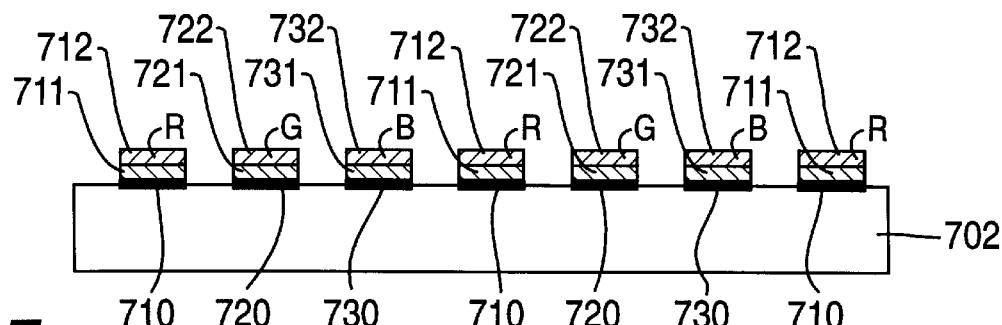
FIG. 7 shows a partial cross sectional view of a three color electroluminescent display formed using an exemplary method according to the present invention.

As described with regard to FIG. 7, a method according to the present invention may be used for forming an electroluminescent display structure. FIG. 7 shows a partial cross section of an exemplary three color electroluminescent display. A plurality of electrodes 710, 720, 730 are formed on a glass substrate 702. A hole transport layer 711, 721, 731 and an emissive layer 712, 722, 732 are formed on each of the plurality of electrodes 710, 720, 730.

For depositing an emissive layer for the first color, the electrodes 710 corresponding to the first color are charged to a second polarity. Portions of a hole transport material charged to a first polarity and an emissive material charged to the first polarity are then deposited on the electrodes 710 to form the hole transport layers 711 and the emissive layers 721. As described above, these layers may be separately deposited or may be deposited in a single step. In an exemplary embodiment, the emissive material is an organic electroluminescent material. Organic electroluminescent materials are described by Friend et al. in U.S. Pat. No. 5,807,627 which is incorporated herein by reference for its teachings on compositions of organic electroluminescent materials.

In an exemplary embodiment, the electrodes 720, 730 corresponding to the second and third colors are charged to first polarity during deposition on the electrodes 710 corresponding to the first color to repel the materials to be deposited on the electrodes 710. A current meter (see FIG. 2) may be used to determine whether any material intended for the electrodes 710 corresponding to the first color is deposited on electrodes 720, 730 corresponding to the second and third colors. If so, the quantity of charge detected may be used to determine whether the resulting color impurity of the display will exceed an acceptable threshold. In addition, the potential applied to the electrodes 710, 720, 730 may be varied to control the level of color impurity.

The electrodes 720 corresponding to the second color are then charged to the second polarity and the hole transport layer 721 and emissive layer 722 are similarly deposited on the electrodes 720. The method is repeated to deposit the hole transport layer 731 and emissive layer 732 on the electrodes 730 corresponding to the third color.

In an exemplary embodiment, a common hole transport material is used and the hole transport layers 711, 721, 731 are all deposited in a single deposition step. The emissive layers 712, 722, 732 are then deposited in three deposition steps according to the present invention.

In the above example, the electrodes of the display structure serve a dual function. First, the electrodes are used to activate individual display elements. Second, the electrodes may be used according to the present invention for depositing materials for forming the individual display elements. As known to those skilled in the art, the driving circuitry of the electrodes may be adapted to provide the appropriate signals to the electrodes for both of the above electrode functions.

An exemplary embodiment is described below for using a method according to the present invention to form a pixel by depositing an organic electroluminescent material having approximate length and width dimensions of 1 mm×1 mm and a 50 nm thickness. The material volume to be deposited corresponding to the above dimensions is $5 \times 10^{-8}$ cm$^3$. In this exemplary embodiment, the source 106 provides portions 112 of material in the form of liquid droplets. The number of droplets to form the pixel vary according to the size of the droplets and the concentration of the material in the droplets. Table 1 below gives exemplary numbers of droplets for different droplet sizes and different concentrations of material per droplet.

TABLE 1

| Droplet Diameter | Droplet | Number of Droplets for Different Concentrations (% of weight) | | |
|---|---|---|---|---|
| (μm) | Volume (cm$^3$) | Undiluted | 1% | .01% |
| 1 | $1.25 \times 10^{-13}$ | $4 \times 10^5$ | $4 \times 10^7$ | $4 \times 10^9$ |
| 2 | $1 \times 10^{-12}$ | $5 \times 10^4$ | $5 \times 10^6$ | $5 \times 10^8$ |
| 10 | $.25 \times 10^{-10}$ | 2000 | $2 \times 10^5$ | $2 \times 10^7$ |
| 100 | $1.25 \times 10^{-7}$ | .4 | 40 | 4000 |

The values provided in Table 1 are merely exemplary. In exemplary embodiments, droplet diameters ranging from 10 μm to 100 μm may be used. In exemplary embodiments, weight percentages of the material in the drops between 0.01% and 50% may be used. In a preferred embodiment, the weight percent of the material in the drops is between 0.5% and 5.0%.

As known to those skilled in the art, factors limiting the amount of charge per drop include the Rayleigh limit and breakdown. The Rayleigh limit limits the charge $q_R$ on a drop according to equation (1) below:

$$q_R = 8\pi(\epsilon_o T a^3)^{1/2}$$

where T is the surface tension of the drop, a is the drop diameter, and $\epsilon_o$, is the permittivity of the air or other gas around the drop. In an exemplary embodiment, the source 106 provides liquid droplets including the material and a solvent. As the solvent evaporates and the diameter of the drop decreases, the drop splits due to the Rayleigh limit. This allows for smaller portions of a material to be deposited. In an exemplary embodiment, the material deposited on an electrode has a width less than 10 μm. In another exemplary embodiment, the deposited material has a width of about 1 μm.

In an exemplary embodiment of the present invention, the droplets are negatively charged, the first selected electrodes 114 are charged to +500 volts, the droplets have a diameter of 50 nm, and the droplets have a charge of $3\times10^{13}$ coulombs. If used, the grid may be charged to −1500 volts and the sidewalls may be charged to −10,000 volts, or, alternatively, insulating walls may be used and left floating.

The present invention may also be used to form other types of display structures. For example, a method of deposition according to the present invention may be used to deposit filters on LCD displays or phosphors on CRT displays. The present invention may be used to form both tiled and non-tiled display structures.

Although the present invention is described above with regard to forming display structures, the present invention is generally applicable to patterned deposition of a material. For example, the plurality of electrodes may be formed in a substrate to serve the sole function of providing a means for attracting the charged portions of material according to the present invention.

In an exemplary embodiment, the plurality of electrodes 104 are formed within the substrate and a method of deposition according to the present invention is used to deposit a material on the substrate adjacent the first selected electrodes 114. In another exemplary embodiment, the plurality of electrodes 104 are formed on a first substrate and a second substrate is disposed upon the first substrate. A method of deposition according to the present invention may then be used to deposit a material on the second substrate in positions above the first selected electrodes 114. The second substrate and the deposited material may then be removed from the first substrate.

As described above, deposition according to the present invention may be used to selectively attract liquid droplets including a material for deposition in liquid form onto charged electrodes. The source 106 may also provide particles of a material which are deposited onto charged electrodes.

Alternatively, the source 106 may provide liquid droplets including a material and a solvent adapted for the solvent to evaporate before attachment to an electrode. Thus, material in a liquid droplet generated by the source 106 may be deposited as a particle. As known to those skilled in the art, the evaporation of the solvent will vary according to factors including the distance of the source from the electrodes, the speed of travel of the portions of material, the atmosphere through which the portions of material travel, and the type of solvent used.

The method of forming a liquid droplet including a material to ultimately deposit the material in particle form may be used for depositing incompatible materials. For example, a first material and a second material may react with each other when in liquid form but react less (or not at all) with each other when in particle form.

Droplets including the first material and droplets including the second material may be charged to the same polarity. The droplets may then be attracted to selected electrodes according to the present invention. The droplets may be adapted for the solvent(s) within them to evaporate before deposition so the first material and the second material are deposited in particle form. The droplets of the first and second materials will not react before deposition because they are charged to the same polarity and will repel each other. Alternatively, droplets of the first material and droplets of the second material may be sequentially deposited such that neither contacts the other while in liquid form. In an exemplary embodiment, the method above is used to form a glucose measurement sensor and the first material is glucose oxidase and the second material is ferrocyanide.

Depositing a portion of a material starting from a liquid droplet containing the material provides advantages regardless of whether the material is ultimately deposited in liquid or particle form. For example, many materials to be deposited may be formed in a liquid solution which is dried and pulverized to form a powder which is used for deposition. This step may be eliminated by the present invention.

Starting from a liquid droplet may allow deposition of smaller particles than by starting with particles because after particles are ground into smaller particles, small particles may aggregate with other particles. The charge applied to the droplets helps prevent aggregation of droplets.

A droplet is not necessarily limited to including only the material and a solvent. For example, a droplet may include additives to modify surface tension for charging and wetting, stabilizers, binders and dopants.

Starting as a liquid allows precise control of the amount of material deposited. For example, factors including the concentration of material in the liquid droplets and the size of the droplets determine the amount of material corresponding to each portion of material deposited. The precise control of these factors allows precise control of deposited particle size and amount. The amount of material may be diluted to an extent where each droplet includes only a few molecules. This allows application of the present invention to forming display structures with micron size pixels.

A method of deposition according to the present invention provides several advantages over the use of inkjet deposition: the source 106 is not required to be in close proximity to the substrate; the present invention does not have the dispersion problem of inkjet technology since the portions 112 of material are attracted to electrodes on the substrate; simultaneous deposition on a plurality of positions on a substrate is possible; the present invention allows precise deposition without precise placement of the source 106; and the present invention allows precise control of the quantity of material deposited on each of the positions on the substrate.

A method of deposition according to the present invention may be used to deposit small amounts of a material in a small localized area without incompatibility problems that may occur with lithographic techniques. For example, organic electroluminescent materials may interact with oxygen, moisture, and solvents used for lithography. The method of the present invention may be adapted to be compatible with a particular material being deposited to avoid such incompatibilities.

The present invention is not limited to deposition directly on electrodes. For example, a material may be deposited on a thin layer just above the electrodes.

Although the present invention is described above with portions 112 of a material charged to a first polarity and the first selected electrodes 114 charged to a second polarity opposite the first polarity, alternatively, the first selected electrodes 114 may be left uncharged and all other electrodes may be charged to a potential having the same polarity as the charged portions 112 of the material. The charged portions 112 of material may migrate toward the lowest potential which in this case is the first selected electrodes 114.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method for depositing display material onto a display structure comprising the steps of:
   (a) providing a first substrate having a plurality of distinct electrodes;
   (b) forming a plurality of liquid droplets including portions of the display material charged to a first polarity; and
   (c) selectively attracting the plurality of liquid droplets toward first selected electrodes of the plurality of distinct electrodes to selectively deposit the plurality of portions of the display material directly on the first selected electrodes to be in electrical contact with the first selected electrodes.

2. The method of deposition according to claim 1 wherein step (c) includes charging the first selected electrodes to a second polarity opposite the first polarity.

3. The method of deposition according to claim 1 wherein step (c) includes charging electrodes other than the first selected electrodes to the first polarity.

4. The method of deposition according to claim 1 further comprising the step of orienting the first substrate in relation to the plurality of liquid droplets charged to the first polarity wherein, in step (c), the plurality of liquid droplets are attracted toward the first selected electrodes in a direction different from the direction of the force of gravity.

5. The method of deposition according to claim 1 wherein each of the plurality of liquid droplets includes a solvent and step (c) includes selectively depositing the plurality of liquid droplets on the first selected electrodes before the solvent evaporates.

6. The method of deposition according to claim 1 wherein step (c) includes selectively depositing a predetermined amount of the display material on the first selected electrodes.

7. The method of deposition according to claim 6 wherein step (c) includes:
   measuring a quantity of charge associated with the plurality of liquid droplets charged to the first polarity;
   selectively controlling, responsive to the measured quantity of charge, at least one of
      (1) charging of the first selected ones of the plurality of electrodes and
      (2) a rate of forming the plurality of liquid droplets charged to the first polarity.

8. The method of deposition according to claim 6 wherein step (c) includes:
   measuring a level of current applied to at least one of the first selected electrodes; and
   providing a value corresponding to a quantity of the display material attracted to the at least one of the first selected electrodes responsive to the measured current level.

9. The method of deposition according to claim 8 wherein step (c) further includes the step of selectively controlling charging of the at least one of the first selected electrodes responsive to the value corresponding to the quantity of the material attracted to the at least one of the first selected electrodes.

10. The method of deposition according to claim 6 wherein step (c) includes charging each of the first selected electrodes with a respective predetermined quantity of charge wherein the amount of material deposited on each of the first selected electrodes corresponds to its respective predetermined quantity of charge.

11. The method of deposition according to claim 1 wherein step (b) comprises forming the plurality of liquid droplets including portions of the display material charged to the first polarity and the method further comprises the steps of:
   (d) forming a plurality of portions of a further display material charged to the first polarity; and
   (e) charging second selected electrodes of the plurality of electrodes to a second polarity to selectively attract the plurality of portions of the further display material to the second selected electrodes.

12. The method of deposition according to claim 11 wherein step (c) includes depositing the display material on one of a column electrode and a row electrode of a display structure and step (e) includes depositing the further display material on one of a column electrode and a row electrode of the display structure.

13. The method of deposition according to claim 11 wherein the first selected electrodes are exclusive of the second selected electrodes and the method of deposition further comprises the step of:
   (f) charging the first selected electrodes to one of the first polarity and a neutral polarity whereby the plurality of portions of the further display material are selectively attracted to the second selected electrodes.

14. The method of deposition according to claim 1 wherein:
   step (b) includes forming a plurality of portions of the material wherein each of the plurality of portions has a volume ranging between about $1.25 \times 10^{-7}$ cm$^3$ and $1.25 \times 10^{-13}$ cm$^3$; and
   step (c) includes depositing a layer of the material having a thickness ranging between about 50nm and 500nm on the first selected electrodes.

15. The method of deposition according to claim 1 wherein the display material is a first display material and the method further comprises the step of forming a plurality of liquid droplets, including a second display material, charged to the first polarity and step (c) includes the step of depositing the liquid droplets of the first display material and the liquid droplets of the second display material on the first selected electrodes.

16. The method of deposition according to claim 1 further comprising the step of performing post deposition processing to improve attachment of the display material on the first selected electrodes.

17. The method of deposition according to claim 16 wherein the post deposition processing includes at least one of applying humidity, applying heat, applying solvent vapor and applying pressure to the first selected electrodes and the display material deposited thereupon.

18. A method of deposition comprising the steps of:
   (a) providing a first substrate having a plurality of distinct electrodes;
   (b) forming a plurality of liquid droplets including a solvent and portions of a material charged to a first polarity;
   (c) selectively attracting the plurality of liquid droplets toward first selected electrodes of the plurality of distinct electrodes;
   (d) evaporating the solvent to convert the plurality of liquid droplets including the material to form a plurality of particles of the material; and
   (e) selectively depositing the plurality of particles of the material on the first selected electrodes.

19. The method of deposition comprising the steps of:
   (a) providing a first substrate having a plurality of distinct electrodes;

(b1) forming a first solution including a hole transport material and a first solvent, and a second solution including an emissive material and a second solvent; and (b2) forming a plurality of liquid droplets including the first and second solutions and charged to the first polarity, and (c) selectively attracting the plurality of liquid droplets including the hole transport material and the emissive material toward first selected electrodes of the plurality of distinct electrodes and depositing the plurality of liquid droplets on the first selected electrodes wherein the droplets deposited on one of the first selected electrodes coalesce and the hole transport material and the emissive material in the droplets on the one of the first selected electrodes separate before the first and second solvents evaporate to form a hole transport material layer and an emissive material layer upon the one of the first selected electrodes.

20. The method of deposition according to claim 19 wherein step (b1) comprises forming a first solution including a hole transport material and a first solvent, and a second solution including an organic electroluminescent material and a second solvent wherein, in step (c), the hole transport material and the organic electroluminescent material in the droplets on the one of the first selected electrodes separate before the first and second solvents evaporate to form a hole transport material layer and an organic electroluminescent material layer upon the one of the first selected electrodes.

* * * * *